(12) United States Patent
Devalla et al.

(10) Patent No.: US 11,266,007 B2
(45) Date of Patent: Mar. 1, 2022

(54) LINECARD SYSTEM USING RISER PRINTED CIRCUIT BOARDS (PCBS)

(71) Applicant: Arista Networks, Inc., Santa Clara, CA (US)

(72) Inventors: Pranav Devalla, Santa Clara, CA (US); Harold Wang, Santa Clara, CA (US); Prasad Venugopal, Santa Clara, CA (US); Aravind Musunuri, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 56 days.

(21) Appl. No.: 16/575,171

(22) Filed: Sep. 18, 2019

(65) Prior Publication Data
US 2021/0084749 A1    Mar. 18, 2021

(51) Int. Cl.
*H05K 1/02* (2006.01)
*H05K 1/14* (2006.01)
*H01R 12/52* (2011.01)
*H01R 12/72* (2011.01)

(52) U.S. Cl.
CPC .......... *H05K 1/0209* (2013.01); *H01R 12/52* (2013.01); *H01R 12/724* (2013.01); *H05K 1/144* (2013.01); *H05K 2201/066* (2013.01)

(58) Field of Classification Search
CPC ... H05K 7/20718; H01R 12/52; H01R 12/724
See application file for complete search history.

(56) References Cited

U.S. PATENT DOCUMENTS

| | | | |
|---|---|---|---|
| 3,697,927 A | 10/1972 | Kunkle et al. | |
| 3,715,629 A | 2/1973 | Swengel | |
| 5,296,748 A | 3/1994 | Wicklund et al. | |
| 5,887,158 A | 3/1999 | Sample | |
| 5,943,490 A | 8/1999 | Sample | |
| 5,960,191 A | 9/1999 | Sample et al. | |
| 6,163,464 A | 12/2000 | Ishibashi et al. | |
| 6,168,469 B1 | 1/2001 | Lu | |
| 6,466,008 B1 | 10/2002 | Fung et al. | |
| 6,538,899 B1 | 3/2003 | Krishnamurthi et al. | |
| 6,694,464 B1 | 2/2004 | Quayle et al. | |

(Continued)

OTHER PUBLICATIONS

PCT Application PCT/US2018/047588 filed Aug. 22, 2018, Written Opinion dated Dec. 6, 2018, 7 pages.

(Continued)

*Primary Examiner* — Hung V Ngo
(74) *Attorney, Agent, or Firm* — Fountainhead Law Group P.C.

(57) ABSTRACT

A network device having improved thermal cooling is provided. The network device comprising a first printed circuit board (PCB) having a plurality of common connectors and one or more second PCBs, each second PCB coupled to the first PCB by a respective common connector of the plurality of common connectors. Each second PCB may include a set of ports, each port in the set of ports coupled to the respective common connector via the second PCB. The one or more second PCBs may be arranged vertically parallel on a front side of the first PCB such that each second PCB forms a 90 degree angle with the first PCB to allow air to flow in spaces defined between vertically adjacent second PCBs.

20 Claims, 11 Drawing Sheets

(56) References Cited

U.S. PATENT DOCUMENTS

| | | |
|---|---|---|
| 6,704,307 B1 | 3/2004 | Graves et al. |
| 6,757,748 B1 | 6/2004 | Hipp |
| 6,795,885 B1 | 9/2004 | deBlanc et al. |
| 6,932,649 B1 | 8/2005 | Rothermel et al. |
| 6,997,736 B2 | 2/2006 | Costello et al. |
| 7,388,757 B2 | 6/2008 | Moakes et al. |
| 7,764,511 B2 | 7/2010 | Lee et al. |
| 7,885,066 B2 | 2/2011 | Boyden et al. |
| 7,929,310 B2 | 4/2011 | Belady et al. |
| 8,208,253 B1 | 6/2012 | Goergen et al. |
| 8,267,699 B2 | 9/2012 | Li |
| 8,500,454 B2 | 8/2013 | Hirano et al. |
| 8,579,636 B2 | 11/2013 | Davis et al. |
| 8,842,441 B2 | 9/2014 | Bai et al. |
| 8,861,222 B2 | 10/2014 | Wen et al. |
| 9,116,660 B1 | 8/2015 | Widmann et al. |
| 9,136,624 B1 | 9/2015 | Reynov et al. |
| 9,362,641 B2 | 6/2016 | Bachmutsky |
| 9,559,446 B1 | 1/2017 | Wetzel et al. |
| 9,582,057 B2 | 2/2017 | Hartman |
| 9,794,195 B1 | 10/2017 | Wilson et al. |
| 9,888,605 B2 | 2/2018 | Xu et al. |
| 9,904,336 B1 | 2/2018 | Khan et al. |
| 10,225,953 B2 | 3/2019 | Gernert |
| 2001/0046794 A1 | 11/2001 | Edholm |
| 2002/0046878 A1 | 4/2002 | Uzuka et al. |
| 2002/0182899 A1 | 12/2002 | Debord et al. |
| 2003/0200330 A1 | 10/2003 | Oelke et al. |
| 2004/0221106 A1 | 11/2004 | Perego et al. |
| 2005/0047098 A1 | 3/2005 | Garnett et al. |
| 2005/0207134 A1 | 9/2005 | Belady et al. |
| 2006/0073709 A1 | 4/2006 | Reid |
| 2006/0187634 A1 | 8/2006 | Tanaka et al. |
| 2006/0264085 A1 | 11/2006 | Kwatra et al. |
| 2007/0232089 A1 | 10/2007 | Fung |
| 2008/0112133 A1 | 5/2008 | Torudbakken et al. |
| 2008/0112152 A1 | 5/2008 | Figueroa et al. |
| 2009/0009960 A1 | 1/2009 | Melanson et al. |
| 2009/0016019 A1 | 1/2009 | Bandholz |
| 2009/0149041 A1 | 6/2009 | Morlion et al. |
| 2009/0216920 A1 | 8/2009 | Lauterbach et al. |
| 2010/0014248 A1 | 1/2010 | Boyden et al. |
| 2011/0002108 A1 | 1/2011 | Dahlfort et al. |
| 2011/0210123 A1 | 9/2011 | Lin et al. |
| 2012/0120596 A1 | 5/2012 | Bechtolsheim |
| 2012/0294314 A1 | 11/2012 | Campbell et al. |
| 2013/0151745 A1 | 6/2013 | Yin et al. |
| 2013/0215563 A1 | 8/2013 | Behziz et al. |
| 2013/0337665 A1 | 12/2013 | Cohen et al. |
| 2014/0133091 A1 | 5/2014 | Shah et al. |
| 2014/0220795 A1 | 8/2014 | Bai et al. |
| 2014/0293998 A1 | 10/2014 | Cheung et al. |
| 2015/0036280 A1 | 2/2015 | Gektin et al. |
| 2015/0162680 A1 | 6/2015 | Costello et al. |
| 2015/0186319 A1 | 7/2015 | Blevins et al. |
| 2015/0280827 A1 | 10/2015 | Adiletta et al. |
| 2015/0289406 A1 | 10/2015 | Coteus et al. |
| 2016/0183402 A1 | 6/2016 | Tamarakin et al. |
| 2017/0017052 A1 | 1/2017 | Costello |
| 2017/0269871 A1 | 9/2017 | Khan et al. |
| 2017/0359923 A1 | 12/2017 | Franz et al. |
| 2018/0359194 A1 | 12/2018 | Yang |
| 2019/0104632 A1 | 4/2019 | Nelson et al. |
| 2019/0207342 A1 | 7/2019 | Aden et al. |
| 2019/0307014 A1 | 10/2019 | Adiletta et al. |
| 2020/0036058 A1 | 1/2020 | van Lammeren |
| 2020/0195583 A1 | 6/2020 | Ramalingam et al. |
| 2020/0195585 A1 | 6/2020 | Bechtolsheim et al. |
| 2020/0195586 A1 | 6/2020 | Weaver |
| 2020/0329286 A1* | 10/2020 | Rose ................. H04Q 1/04 |

OTHER PUBLICATIONS

U.S. Appl. No. 16/381,077, filed Apr. 11, 2019 (unpublished), 41 pages.

* cited by examiner

LINECARD SYSTEM USING RISER PRINTED CIRCUIT BOARDS (PCBS)

BACKGROUND

Electronic devices (e.g., computing devices, network devices, etc.) may use various cards that include circuit boards and connectors. The connectors may be used to connect the cards to each other. For example, a network switch may have one or more fabric cards (e.g., a component of the network switch) that are coupled to one or more line cards (e.g., another component of the network switch) via one or more connectors. Each line card may have multiple lines, front end connectors, network interfaces, etc. The fabric cards may each contain multiple switch circuits for connecting the line cards.

SUMMARY

In some implementations, a system is provided. The system rises a first printed circuit board (PCB) comprising a plurality of common connectors and one or more second PCBs. Each second PCB may be coupled to the first PCB by a respective common connector of the plurality of common connectors, and each second PCB may include a set of ports. Each port in the set of ports may be coupled to the respective common connector via the second PCB. Each of the one or more second PCBs may be arranged vertically parallel on a front side of the first PCB such that each second PCB forms a 90 degree angle with the first PCB to allow air to flow in spaces defined between vertically adjacent second PCBs.

In some implementations, an apparatus is provided. The apparatus comprises a printed circuit board (PCB) and a set of ports coupled to a front side of the PCB, each port in the set of ports may receive a fabric card. The apparatus may further comprise a mechanism located at a rear side of a bottom edge of the PCB, the mechanism to couple to a common connector. A front side of the bottom edge of the PCB may extend farther than the rear side of the bottom edge.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

As discussed above, electronic devices (e.g., computing devices, network devices, etc.) may use various cards that include circuit boards and connectors. The connectors may be used to connect the cards to each other. One type of electronic device that uses cards and connectors may be a network device, such as a switch, a router, a bridge, etc. A network device may include multiple cards (e.g., fabric cards, line cards, etc.) that are coupled to each other by one or more connectors.

The thermal capacity of a network device is a factor to consider in the design of such a device. Examples of a network device may include a switch, router, hub, bridge, gateway, etc., or any type of device that can communicate data packets with a network. The thermal capacity may directly impact the maximum operating power, among other performance factors. Obstructions for cooling airflow are also factors for design consideration. For example, having more components on a card may obstruct airflow around the card. In addition, increasing the number of components (e.g., processing device) on a card may cause problems in cooling the components. For example, the components may be close together on the circuit board because there is not enough space to spread the components further apart. Network elements utilizing a cage configuration of connectors (e.g., in a 2×6 configuration) to connect fabric cards do not provide a significant amount of space between the connectors. As a result, connectors in a cage configuration may essentially block air from the front of a device (which is generally cooler than air within the device) from reaching the interior of the device, resulting in the fans of such devices pulling hot air from an area of the inside of the device.

The air inside of a device may be heated by heat dissipation from processors and other components. As a result of the cage configuration blocking cool air from the front of the device, only hot air may be circulated within the device resulting in a reduction in the amount of heat that can be dissipated and a lower ambient operating temperature. This in turn causes the maximum operating power to be lowered as well. In addition, the hot air may continue beyond the device out the rear of the device to additional fabric PCBs, for example. The circulation of the hot air towards the other fabric PCBs may cause overheating and subsequent damage to those fabric PCBs as well as to the processors and other components within the device.

Figure 1A:
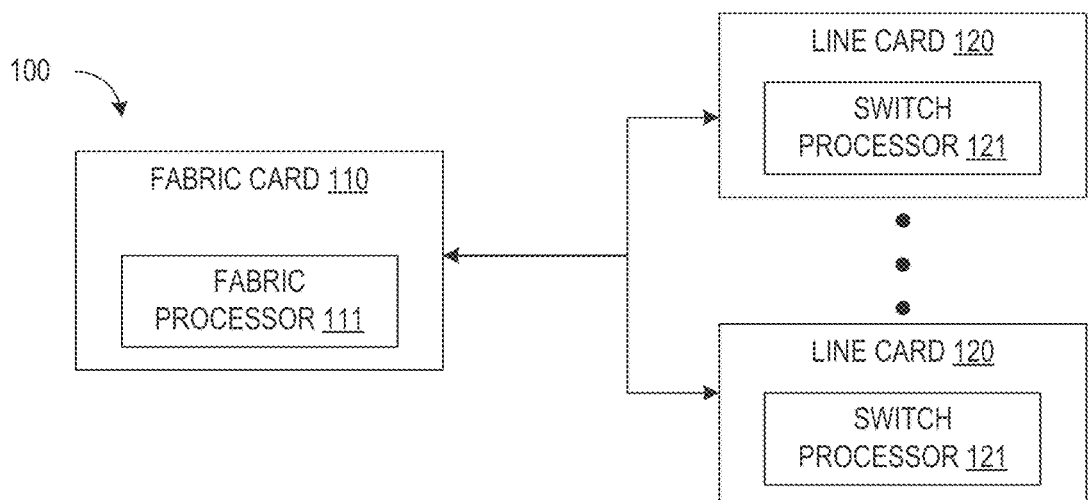
FIGS. 1A and 1B are block diagrams of a network device, in accordance with some embodiments of the present disclosure.

FIG. 1A is a block diagram of a network device 100, in accordance with some embodiments of the present disclosure. Examples of a network device may include a switch (e.g., a network switch), a router (e.g., a network router), a bridge (e.g., a network bridge), etc. The network device 100 includes a fabric card 110 and multiple line cards 120. The fabric card 110 includes a fabric processor 111. The fabric card 110 may communicatively be coupled to multiple line cards 120 via one or more connectors, as discussed in more detail below. Each of the line cards 120 includes a switch processor 121. The switches within the fabric processor 111 may be referred to as switching paths or routing paths. These switching paths or routing paths couple and/or connect ingress and egress ports of fabric processor 111 through the switch fabric in some embodiments. Although the fabric card 110 is illustrated with a fabric processor 111, the fabric card 110 may include a set of fabric processors 111 (e.g., multiple fabric processors 111, one or more fabric processors 111) in other embodiments. In addition, although the line card 120 is illustrated with a switch processor 121, the line card 120 may include a set of switch processors 121 (e.g., multiple switch processors 121, one or more switch processors 121) in other embodiments. The fabric processor 111 may be referred to as a fabric processor and the switching chip 121 may be referred to as switching processors. The fabric processor 111 and switch processor 121 may also be referred to as processing devices. A processing device may be a device that is capable of executing instructions to perform various operations, functions, tasks, etc. Examples of processing devices may include, a processor, a multi-core processor, a central processing unit (CPU), an application specific integrated circuit (ASIC), a field programmable gate array (FPGA), etc.

Figure 1B:
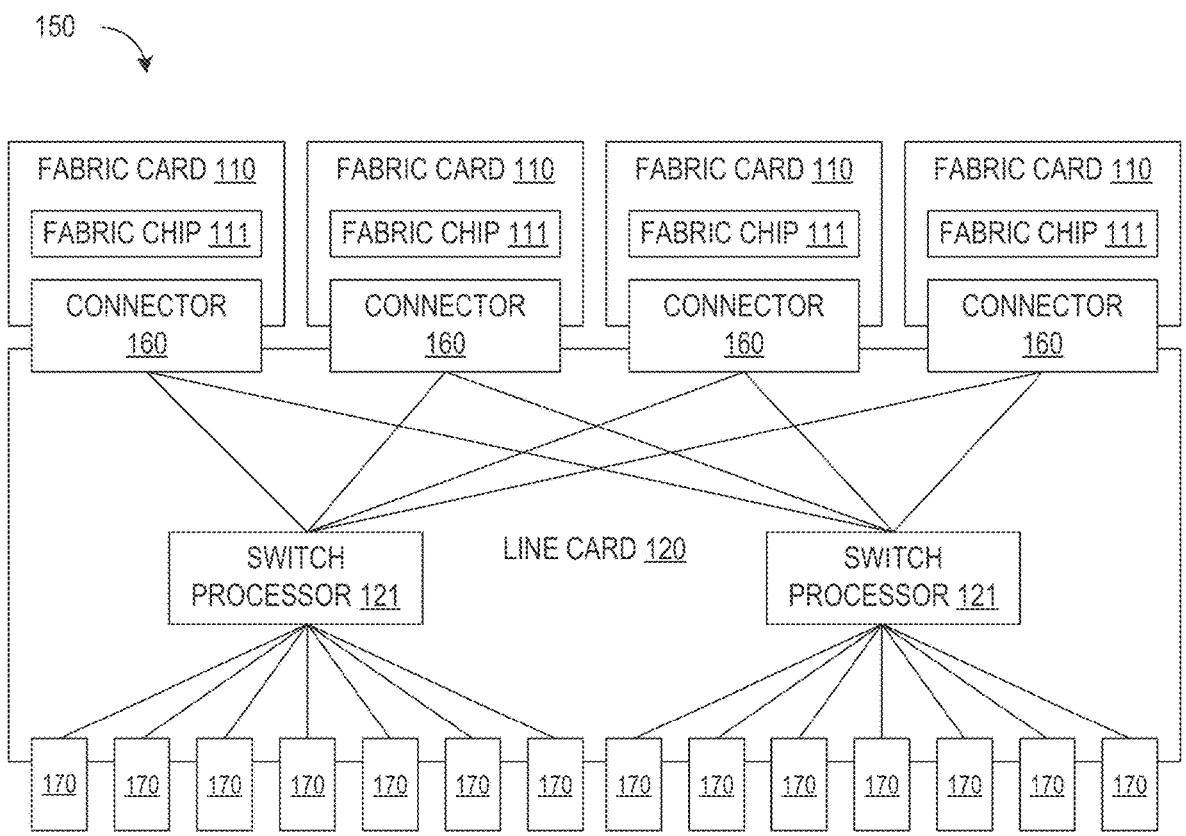

FIG. 1B is a block diagram of a network device 150 (e.g., a switch, a route etc.), in accordance with some embodiments of the present disclosure. The network device 150 includes fabric cards 110 and a line card 120. Each fabric card 110 includes a fabric processor 111. Each fabric card 110 may be communicatively coupled to the line card 120 via a respective connector 160, as discussed in more detail below. The switches within the fabric processor 111 may be referred to as switching paths or routing paths. These switching paths or routing paths couple and/or connect ingress and egress ports of fabric processor 111 through the switch fabric in some embodiments. The line card 120 is illustrated as including two switch processors 121, but may include 3 or any other appropriate number of switch processors. The line card 120 also includes multiple front end connectors 170. The front end connectors 170 may be located on a front panel of the line card 120 such that the front end connectors 170 may be accessible when the line card 120 is inserted or installed into the network device 150 (e.g., into a chassis of the network device 150). The front end connectors 170 may be network interfaces or ports that may accept other devices. Each of the front end connectors 170 may be configured to receive a riser card having a set of ports thereon as discussed in further detail herein. For example, the ports on each riser card may be small form-factor pluggable (SFP) modules, octal SFP (OSFP) modules, and quad SFP (QSFP) modules, etc. In another example, the ports on each riser card may be network interfaces such as Ethernet ports, optical fiber connectors, etc.

Although the fabric card 110 is illustrated with a fabric processor 111, the fabric card 110 may include a set of fabric processors 111 (e.g., one or more fabric processors 111) in other embodiments. In addition, although the line card 120 is illustrated with two switch processors 121, the line card 120 may include more switch processors 121 in other embodiments. The fabric processor 111 and switch processor 121 the may be referred to as processing devices, as discussed above. As illustrated in FIG. 1B, each switch processor 121 is communicatively coupled to a fabric card 110 via a respective connector 160. For example, the left switch processor 121 is coupled to the four fabric cards 110 via their respective connectors 160, and the right switch processor 121 is coupled to the four fabric cards 110 via their respective connectors 160. This allows each switch processor 121 to communicate data (e.g., transmit and/or receive packets, frames, messages, etc.) with each of the fabric processors 111. Connectors 160 can each include multiple connectors. For example, a connector 160 may include a first connector (e.g., a male connector) on a fabric card 110 and a second connector (e.g., a corresponding female connector) on the line card 120.

As discussed above, the line card 120 includes a circuit board and the switch processors 121 may be coupled to the circuit board. The circuit board may include fourteen routing layers (e.g., pins, lines, traces, wires, etc.) that couple the switch processors 121 to the front end connectors 170. The circuit board may also include eight routing layers that couple the switch processors 121 to each of the fabric processors 111. Increasing the number of switch processors 121 and/or increase the number of front end connectors 170 may increase the number of routing layers. For example, if there are four switch processors 121 and eighteen front end connectors 170, a total of thirty two routing layers will be used to connect the switch processors 121 to the front end connectors 170 and the fabric processors. For example, eighteen routing layers will be used to connect the four switch processors 121 to the front end connectors 170 and sixteen routing layers will be used to connector the four switch processors 121 to the four fabric processors 111. The more routing layers that are used in the line card, the thicker the circuit board should be in order to accommodate the routing layers. Increasing the number of routing layers will increase the thickness, cost and/or weight of the circuit board. Increasing the number of routing layers also increases the complexity of the layout of the routing layers. To accommodate the increase in routing layers, small vias connections, pins, traces, wires, lines, etc., that go through the circuit board) may not be usable in order to maintain a proper ratio between the board thickness and the diameter of the vias. Using larger vias may decrease the number of routing layers that may be used in the circuit board. In addition, if too many routing layers are need, it may not be possible to include all of the routing layers within a circuit board.

Figure 2A:
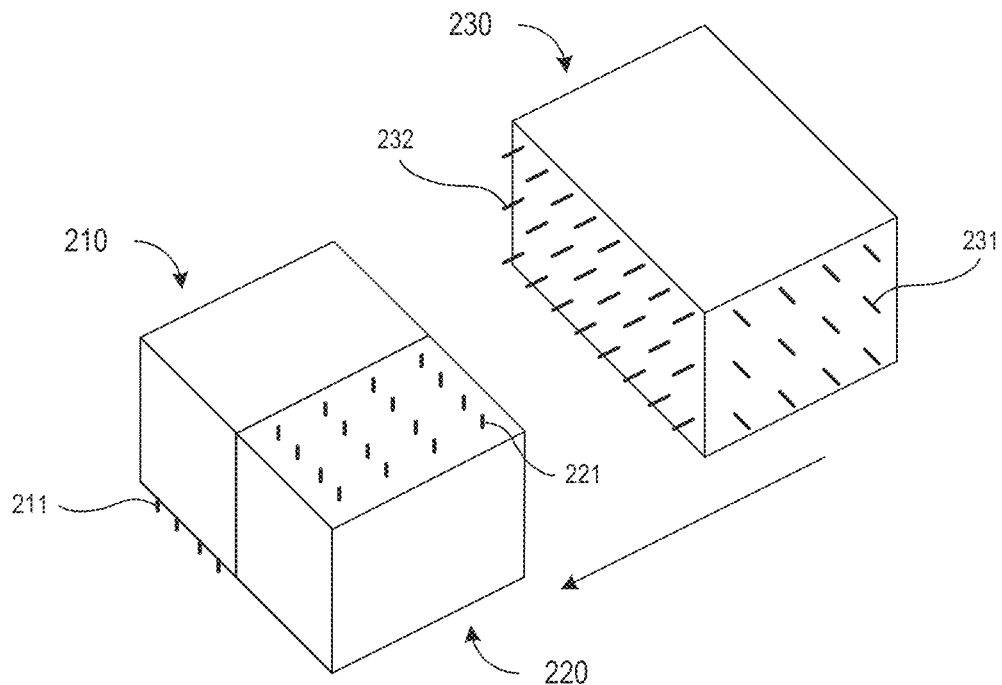
FIG. 2A is a perspective view of connectors, in accordance with some embodiments of the present disclosure.

FIG. 2A is a perspective view of connectors 210, 220, and 230, in accordance with some embodiments of the present disclosure. Various orthogonal connectors are available from vendors, with various numbers of conductors, pins, pin layouts, sockets, pin receptacles, socket layouts, dimensions and relative orientations, and embodiments are not limited to the specific connectors shown herein. The conductors, pins, sockets, pin receptacles, etc., may also be referred to as connections. For example, a pin may be referred to as a connection. In another example, a socket or pin receptacle may be referred to as a connection.

As illustrated in FIG. 2A, pins 232 (e.g., wires, lines, traces, etc.) of connector 230 (e.g., a male connector) may be inserted into sockets or pin receptacles of connectors 210 and 220 (e.g., female connectors). Connector 230 also includes solder pins 231 (e.g., wires, lines traces, etc.) which are perpendicular or orthogonal to pins 232. The solder pins 231 may be used to couple, connect, attach, etc., the connector 230 to a first circuit board (e.g., a printed circuit board (PCB)). Connector 210 includes solder pins 211 which are perpendicular in a downward direction to the pins 232 of the connector 230. The solder pins 211 may be used to couple, connect, attach, etc., the connector 210 to a circuit board. Connector 220 includes solder pins 221 which are perpendicular in an upward direction to the pins 232 of the connector 230. The solder pins 221 may be used to couple, connect, attach, etc., the connector 220 to a circuit board. Although the present disclosure may refer to solder pins, other types of pins or traces may be used. For example, solder tails, etc., may be used in other embodiments.

The connectors 210 and 220 may interface with each other when the connectors 210 and 220 mate with the connector 230. For example, a wall of the connector 210 may interface (e.g., come into contact with, align with, etc.) a wall of the connector 220. In another example, the two connectors 210 and 220 may be pushed, fitted, or interlocked together. In some embodiments, the connectors 210 and 220 may be orthogonal to the connector 230. For example, the first circuit board (coupled to connector 230) may be orthogonal or perpendicular to the first circuit board (coupled to connector 210), as discussed in more detail below. The first circuit board (coupled to connector 230) may also be orthogonal or perpendicular to the second circuit board (coupled to connector 220), as discussed in more detail below. Thus, the connectors 210 and 220, and the connector 230 may be referred to as orthogonal connectors.

Orthogonal connectors may have a specific handedness or orientation of orthogonality (e.g., as keyed), or may have one connector rotatable with respect to the other connector. It should be appreciated that the mating or engagement of connectors 210 and 220, and connector 230 may utilize any suitable orientation that results in the orthogonal orientation discussed herein. In one embodiment, the first circuit board and the second circuit board would meet each other edge to edge, with the edge of the first circuit board adjacent and perpendicular to the edge of the second circuit board, rather than edge to face as is the case with other board connectors, e.g., that position one circuit board perpendicular and coupled to a central region of a face of another circuit board. The first circuit board and the third circuit board would also meet each other edge to edge, with the edge of the first circuit board adjacent and perpendicular to the edge of the second circuit board.

In one embodiment, the second circuit board may be orthogonal to the first circuit board at a 90 degree angle when the connector 210 is mated or coupled to the connector 230. The third circuit board may be orthogonal to the first circuit board at a 270 degree angle when the connector 220 is mated or coupled to the connector 230. In some embodiments, the connector 230 may be part of a mid-plane or a fabric card, as discussed in more detail below. In other embodiments, the connectors 210, 220, and 230 may include housings, as discussed in more detail below.

The term "connector" is understood to apply to a large variety of connectors with a large variety of numbers of conductors, and to groups of connectors, individual connectors, and components of a connector. For example, a male plug having one or more pins or prongs is considered a connector, a female socket having one or more pin or prong receptacles or socket contacts is considered a connector, and the combination of a male plug and female socket is a connector, as are hermaphrodite connectors and their components. Groups of multiple male connectors are considered a connector, as are groups of female connectors, and groups of hermaphrodite connectors. Connections to a connector can be made for example by crimping, soldering (pins or surface mount), or fastening, and can be made by wires, printed circuit board pads, plated through holes, edges or traces, or other connectors among various possibilities.

Figure 2B:
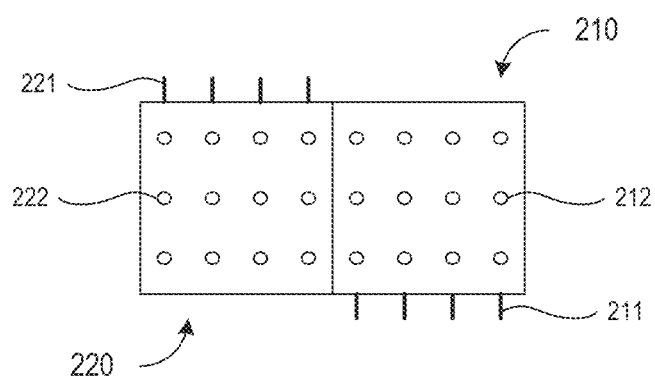
FIG. 2B is a side view of connectors, in accordance with some embodiments of the present disclosure.

FIG. 2B is a side view of connectors 210 and 220, in accordance with some embodiments of the present disclosure. As illustrated in FIG. 2B, connector 210 includes pin receptacles 212 (e.g., sockets) and connector 220 includes pin receptacles 222. As discussed above, pins of another connector may be inserted into the pin receptacles of connectors 212 and 222. Connector 210 includes solder pins 211 and connector 220 includes solder pins 221. The solder pins 211 may be used to couple the connector 210 to a first circuit board and the solder pins 221 may be used to couple the connector 220 to a second circuit board. The first circuit board may be parallel to the second circuit board. Although the present disclosure may refer to solder pins, other types of pins or traces may be used. For example, solder tails, press-fit pins, etc., may be used in other embodiments.

As illustrated in FIG. 2B, the connectors 210 and 220 may interface with each other when the connectors 210 and 220 mate with the connector 230. For example, a right wall of the connector 210 may interface (e.g., come into contact with, align with, etc.) a left wall of the connector 220. In another example, the two connectors 210 and 220 may be pushed, fitted, or interlocked together. The connectors 210 and 220 may include physical features or elements such as rails, slits, slots, grooves, tabs, holes, notches, prongs, etc., that may be used to align the connectors 210 and 220.

Figure 3A:
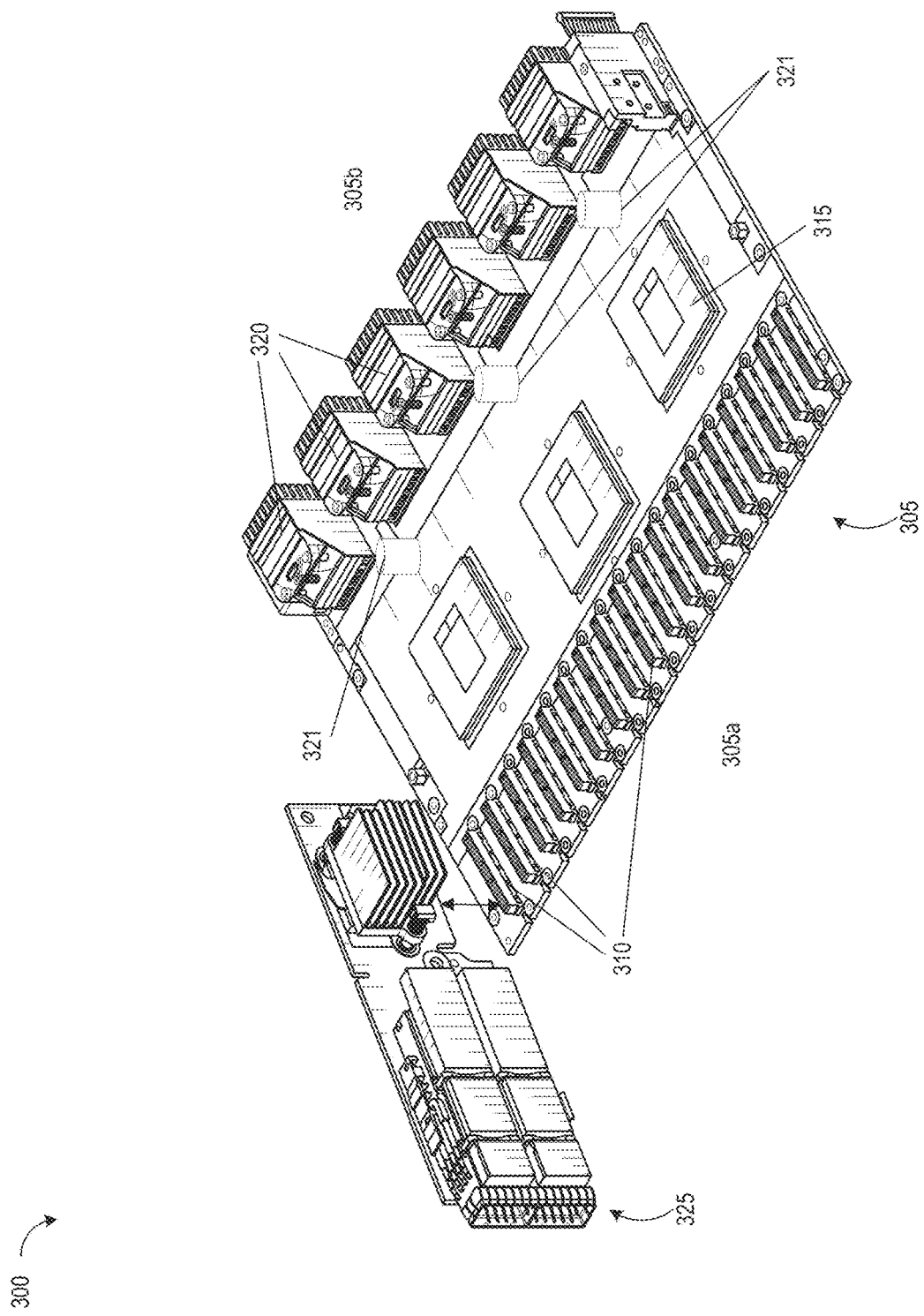
FIG. 3A is a perspective view of a network device, in accordance with some embodiments of the present disclosure.

FIG. 3A is a perspective view of a network device 300, in accordance with some embodiments. Network device 300 may be a 400G switching system, for example. Network device 300 may include a main board 305, which in turn may include a plurality of connectors 310, one or more processors 315, and one or more connectors 320 and one or more fans 321. The main board 305 may also be referred to as a PCB. In some embodiments, each of the processors 315 may be a switch processor. As shown in FIG. 3A, main board 305 may include 18 connectors 310, 3 processors 315, 6 connectors 320 and 3 fans 321. Network device 300 may also include riser card PCB 325, which may be coupled to the main board 305 via one of the connectors 310 as illustrated in FIG. 3A. The plurality of connectors 310 may be arranged vertically parallel to each other (e.g., so as to form a column) along a front side 305a of the main board 305 as illustrated in FIG. 3A. In this way, each riser card PCB 325 that is coupled to a connector 310 may be oriented perpendicularly (e.g., at 90 degrees) to the main board 305 as shown in FIGS. 3A and 3G. Although illustrated in FIG. 3A with one riser card for simplicity, each of the connectors 310 may have a riser card coupled thereto, to form a column of vertically adjacent riser cards along the front edge 305a of the main board 305. When multiple riser card PCB 325s are connected to the main board 305, the riser card PCB 125s may be vertically parallel to each other, thereby forming spaces between each vertically adjacent riser card PCBs 325. As discussed in further detail herein, each riser card PCB 325 may include a set of ports coupled as shown in FIGS. 3A-3E. Because of the spaces formed between vertically adjacent riser cards, each riser card PCB 325 (and thus, the set of ports on each riser card PCB 325) may not be in thermal proximity to any other riser card PCB 325 and its set of ports. Stated differently, each riser card PCB 325 may be thermally isolated from each other riser card PCB 325, meaning there is no thermal interaction between riser card PCBs. The one or more connectors 320 may be arranged vertically parallel (e.g., so as to form a column) along a rear side 305b of main board 305, as illustrated in FIG. 3A. Each fan 321 may draw air from the front side 305a of the main board 305 through channels defined by the spaces between adjacent riser card. PCB 325s as discussed in further detail herein. The one or more processors 315 may be arranged between the connectors 310 and the fans 321 as shown in FIG. 3A.

Figure 3B:
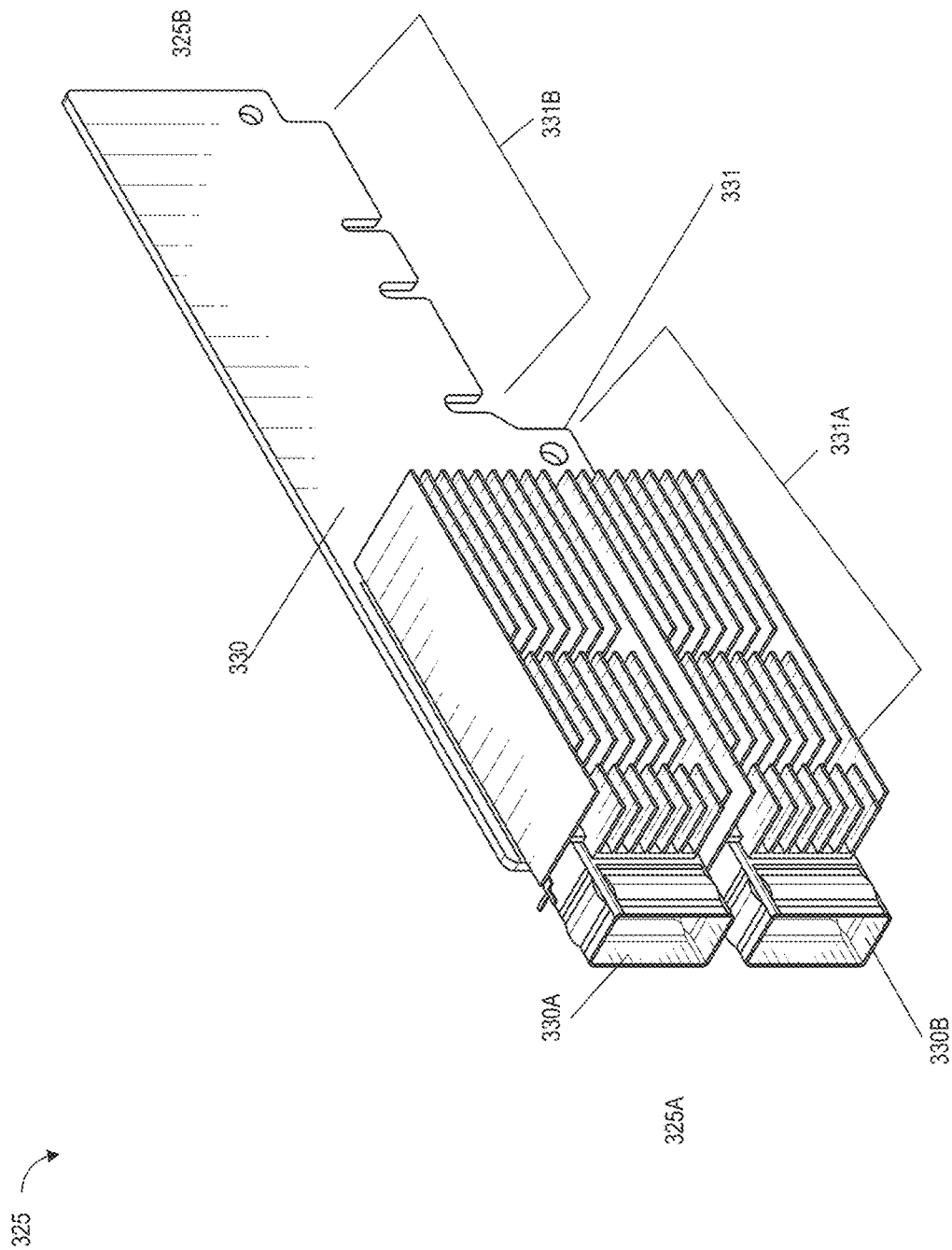
FIG. 3B is a perspective view of a riser card, in accordance with some embodiments of the present disclosure.

FIG. 3B illustrates an isometric view of the riser card PCB 325 illustrated in FIG. 3A in accordance with some embodiments. Riser card PCB 325 may comprise a PCB 330 having riser card ports 330A and 330B coupled thereto. The riser card ports 330A and 330B may be arranged vertically parallel on a front side 325A of the riser card PCB 325 as shown in FIG. 3B. The PCB traces (not shown in the FIGS.) on the riser card 325 may comprise a low loss medium thus allowing each port 330A and 330B to experience reduced levels of board loss. The riser card ports 330A and 330B may be quad small form factor pluggable-double density (QSFP-DD) modules in some embodiments, or octal small form factor pluggable (OSFP) modules in other embodiments. As can be seen, each of the ports 330A and 330B may be equally close to the PCB 330, thus allowing each port 330A and B to experience similar levels of signal delay in reaching the PCB 330 and thus, similar levels of signal delay in reaching the main board 305 as well. In addition, because riser card PCB 325 (and thus each port 330A and B) is connected to main board 305 via a connector 310, each port 330A and B may experience a similar level of connector loss. FIG. 3B also illustrates a bottom edge 331 of the riser card PCB 325. The rear side 331B of the bottom edge 331 may include a mechanism to couple to a respective connector 310 on the main board 305. FIG. 3B also illustrates a front side 331A of the bottom edge 331 of riser card PCB 325, which may extend farther than the rear side 331B of the bottom edge 331 as shown in FIG. 3B, such that when riser card PCB 325 is connected to main board 305, the front side 331A of the bottom edge 331 hangs over and below the front side 305a of main board 305 (illustrated in FIG. 3H). As discussed herein, the rear side 331B of bottom edge 331 of the riser card PCB 325 may include a mechanism configured to couple to a connector 310 of main board 300.

Figure 3C:
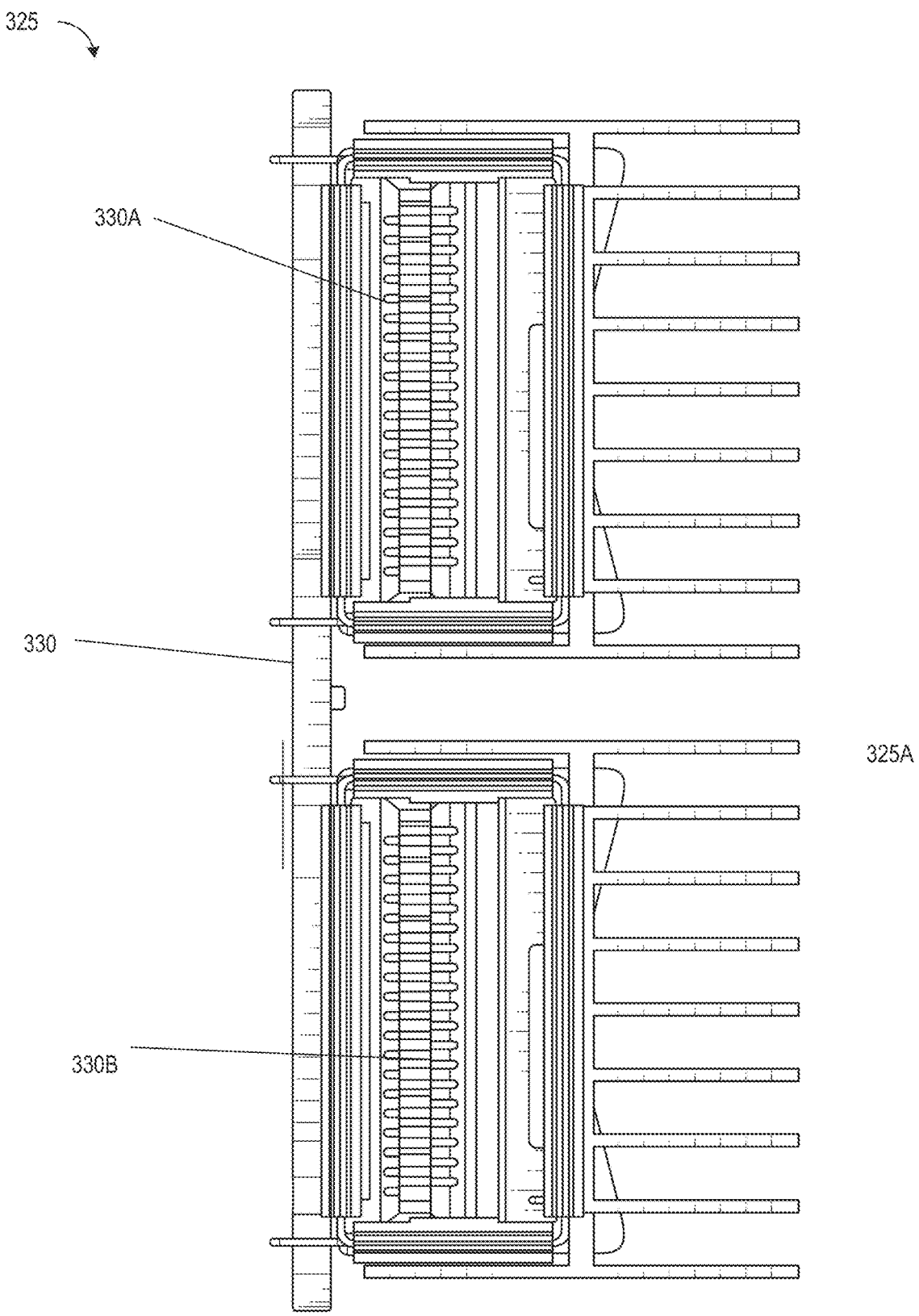
FIG. 3C is a front view of a riser card, in accordance with some embodiments of the present disclosure.

FIG. 3C illustrates a front view of riser card 325. The riser card ports 330A and 330B may be arranged vertically parallel on a front side 325A of the riser card PCB. The PCB traces (not shown in the FIGS.) on the riser card 325 may comprise a low loss medium thus allowing each port 330A and B to experience reduced levels of board loss. As can be seen, each of the ports 330A and 330B may be equally close to the PCB 330, thus allowing each port 330A and B to experience similar levels of signal delay in reaching the PCB 330. In addition, because riser card PCB 325 (and thus each port 330A and B) is connected to main board 305 via a connector 310, each port 330A and B may experience a similar level of connector loss.

Figure 3D:
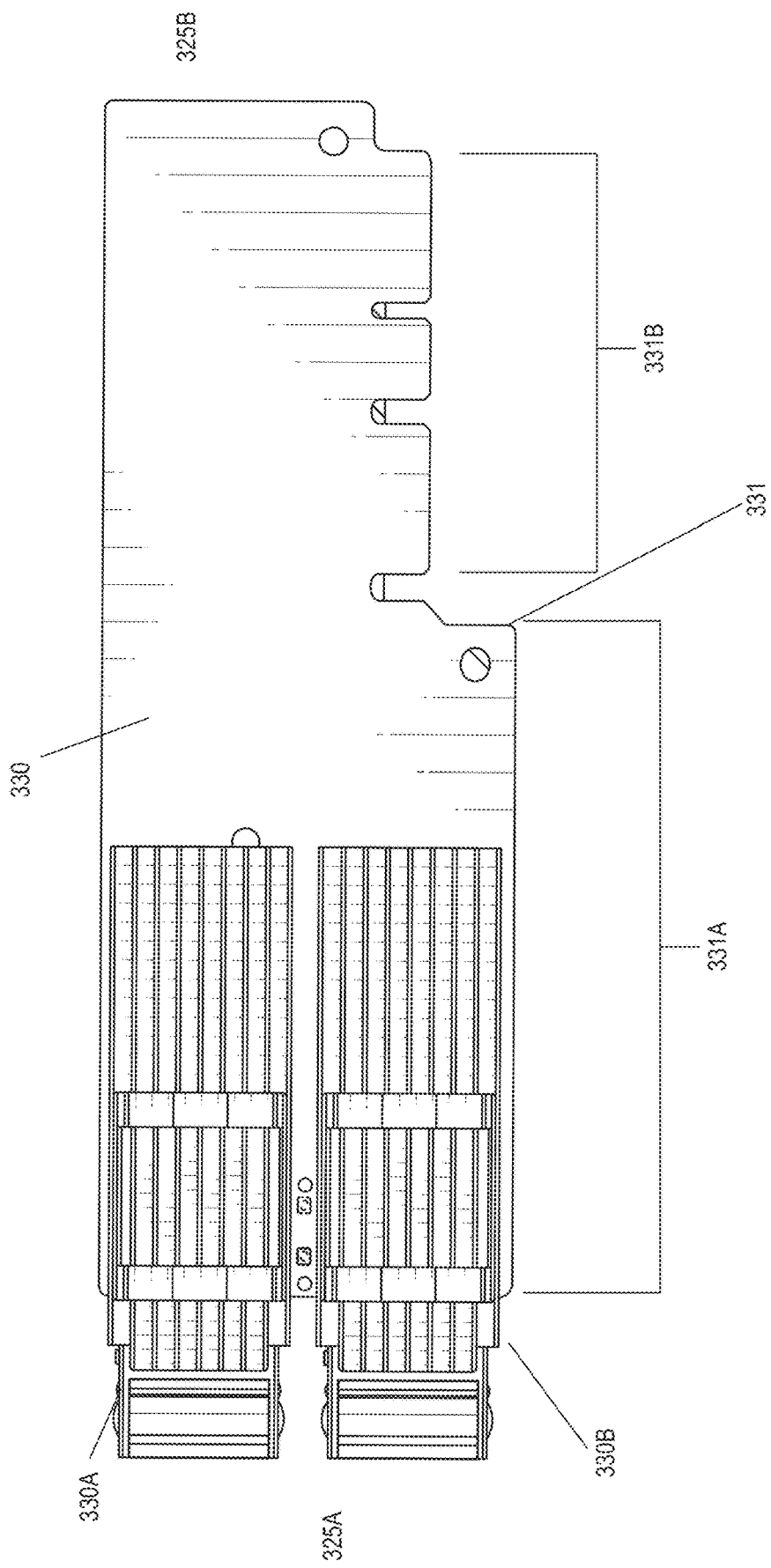
FIG. 3D is a top view of a riser card, in accordance with some embodiments of the present disclosure.

FIG. 3D illustrates a top view of riser card 325. The riser card ports 330A and 330B may be arranged vertically parallel on a front side 325A of the riser card PCB 325 as shown in FIG. 3D. The PCB traces (not shown in the FIGS.) on the riser card 325 may comprise a low loss medium thus allowing each port 330A and 330B to experience reduced levels of board loss. As can be seen, each of the ports 330A and 330B may be equally close to the PCB 330, thus allowing each port 330A and B to experience similar levels of signal delay in reaching the PCB 330. In addition, because riser card PCB 325 (and thus each port 330A and B) is connected to main board 305 via a connector 310, each port 330A and B may experience a similar level of connector loss. FIG. 3D also illustrates the bottom edge 331 of the riser card PCB 325. The rear side 331B of the bottom edge 331 may include a mechanism to couple to a respective connector 310 on the main board 305. FIG. 3D also illustrates a front side 331A of the bottom edge 331 of riser card PCB 325, which may extend below the rear side 331B of the bottom edge 331 as shown in FIG. 3D, such that when riser card PCB 325 is connected to main board 305, the front side 331A of the bottom edge 331 hangs over and below the front side 305a of main board 305 (illustrated in FIG. 3H). As discussed herein, the rear side 331B of bottom edge 331 of the riser card PCB 325 may be configured to couple to a connector 310 of main board 300.

Figure 3E:
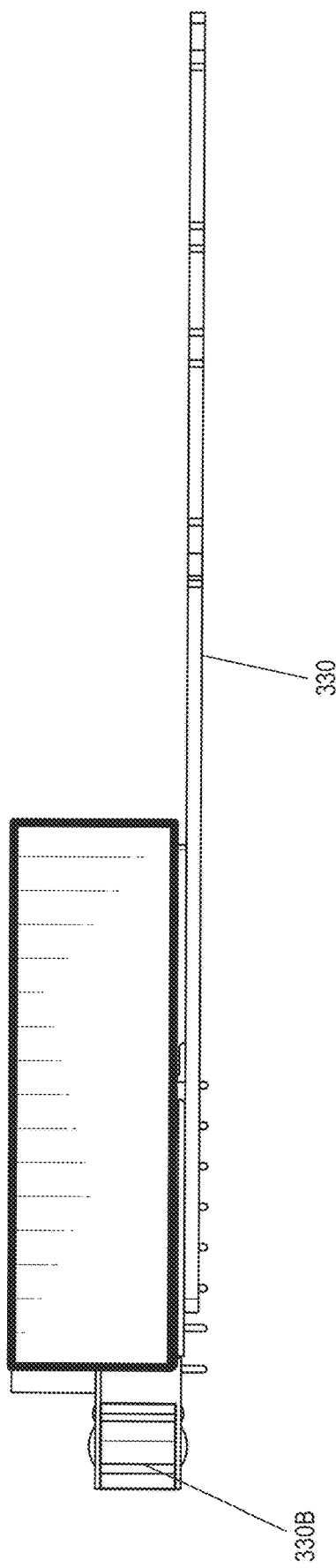
FIG. 3E is a side view of a riser card, in accordance with some embodiments of the present disclosure.

FIG. 3E illustrates a side view of riser card 325. The riser card ports 330A and 330B may be arranged vertically parallel on a front side 325A of the riser card PCB (although in this view, port 330A is obscured from view by port 330B). The PCB traces (not shown in the FIGS.) on the riser card 325 may comprise a low loss medium thus allowing each port 330A and B to experience reduced levels of board loss. Each of the ports 330A and 330B may be equally close to the PCB 330, thus allowing each port 330A and B to experience similar levels of signal delay in reaching the PCB 330. In addition, because riser card PCB 325 (and thus each port 330A and B) is connected to main board 305 via a connector 310, each port 330A and B may experience a similar level of connector loss.

Figure 3F:
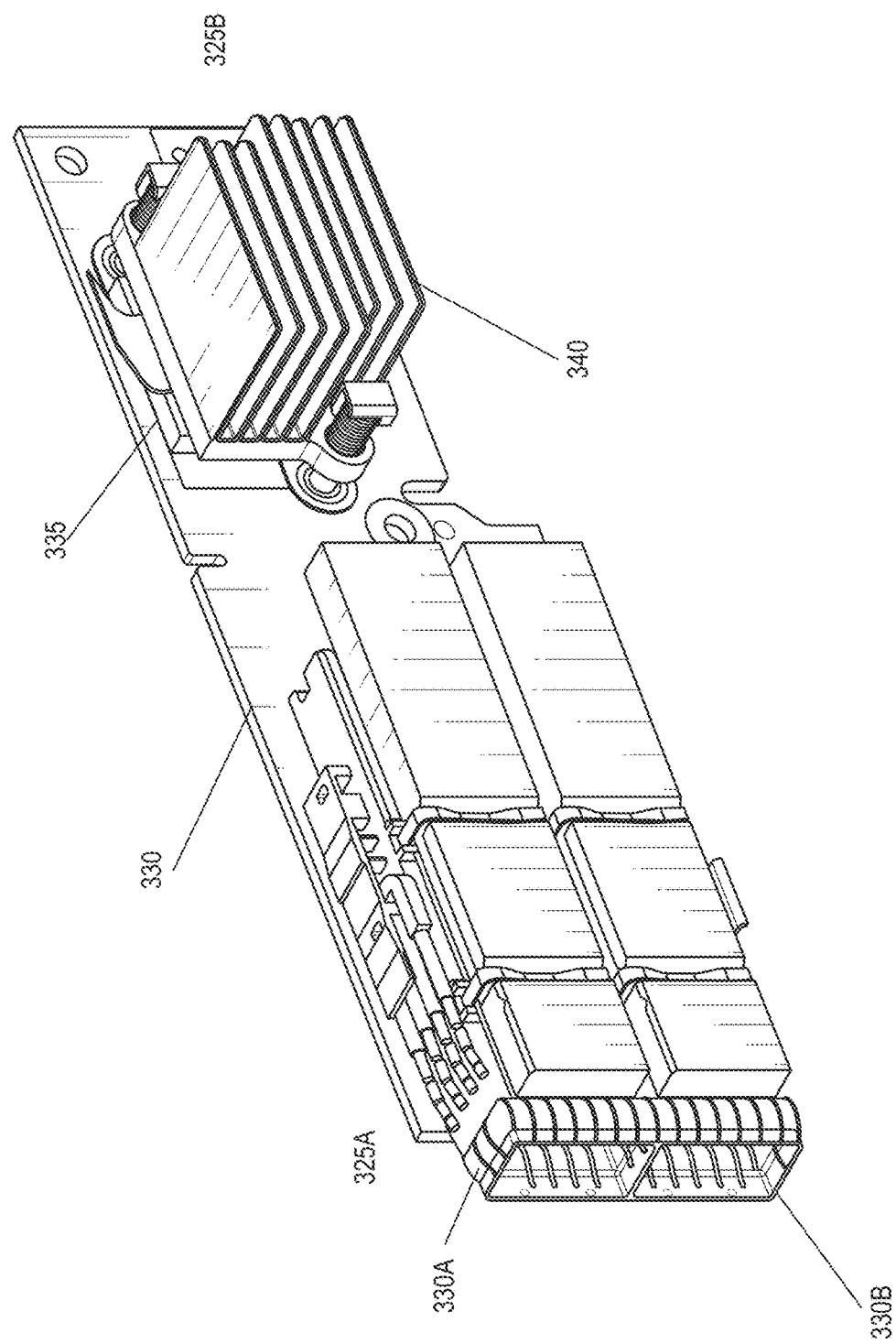
FIG. 3F is a perspective view of a riser card, in accordance with some embodiments of the present disclosure.
Figure 3G:
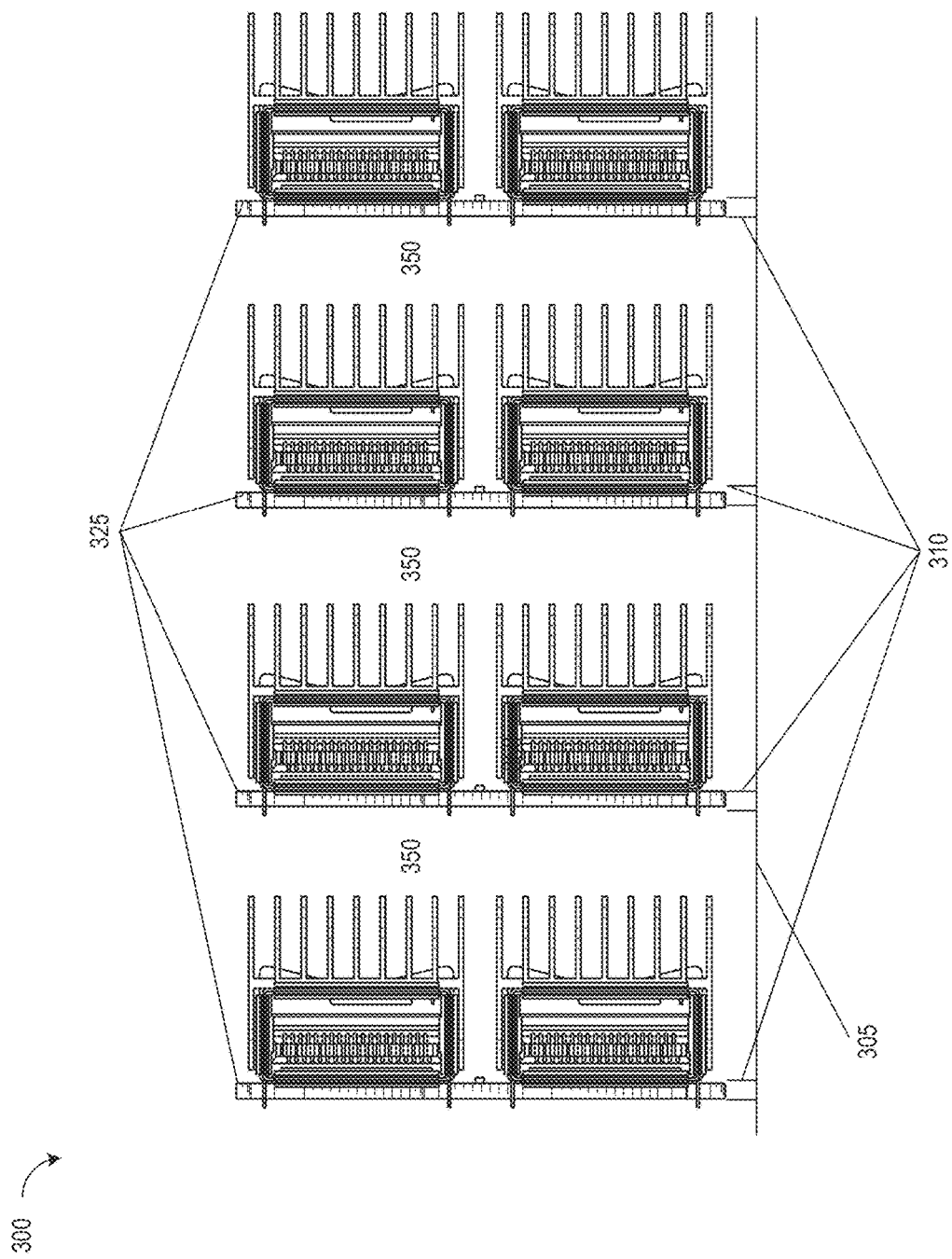
FIG. 3G is a front view of a network device, in accordance with some embodiments of the present disclosure.

FIG. 3F illustrates an isometric view of riser card PCB 325 in accordance with other embodiments of the present disclosure. Riser card PCB 325 may comprise a PCB 330 having riser card ports 330A and 330B coupled thereto. The riser card ports 330A and 330B may be arranged vertically parallel on a front side 325A of the riser card PCB 325 as shown in FIG. 3F. The PCB traces (not shown in the FIGS.) on the riser card 325 may comprise a low loss medium thus allowing each port 330A and B to experience reduced levels of board loss. As can be seen, each of the ports 330A and 330B may be equally close to the PCB 330, thus allowing each port 330A and B to experience similar levels of signal delay in reaching the PCB 330. In addition, because riser card PCB 325 (and thus each port 330A and B) is connected to main board 305 via a connector 310, each port 330A and B may experience a similar level of connector loss. FIG. 3F also illustrates a rear side 331B of the bottom edge 331 of the riser card PCB 325, which may function to couple to a respective connector 310 on the main board 305. FIG. 3B also illustrates front side 331A of the a bottom edge 331 of the riser card PCB 325, which may extend farther than the bottom edge 331B of the rear side 325B as shown in FIG. 3F, such that when riser card PCB 325 is connected to main board 305, the bottom edge 331A of the front side 325A hangs over the front side 305a of main board 305. As discussed herein, the rear side 331B of the bottom edge 331 of the riser card PCB 325 may include a mechanism configured to couple to a connector 310 of main board 300.

As shown in FIG. 3F, riser card PCB 325 may further include an application specific integrated circuit (ASIC) 335, coupled to the PCB 330 adjacent to the rear side 325B of the riser card PCB 325, and adjacent to the ports 330A and 330B. In some embodiments, the ASIC 335 may provide media access control security (MACsec) functionality. Riser card PCB 325 may also include a heat sink 340 coupled to the ASIC 335. In some embodiments, riser card PCB 325 may further include a second heat sink (not shown) which may be coupled to an opposite side of the PCB 330.

FIG. 3G illustrates a front view of the network device 300 (also illustrated in FIG. 3A) illustrating one or more connectors 310 having a riser card PCB 325 coupled thereto.

The space created between vertically adjacent riser cards 325 may define air channels 350, through which cold air from the front of main board 305 may be pulled (e.g., by fans 321) as discussed further herein.

Figure 3H:
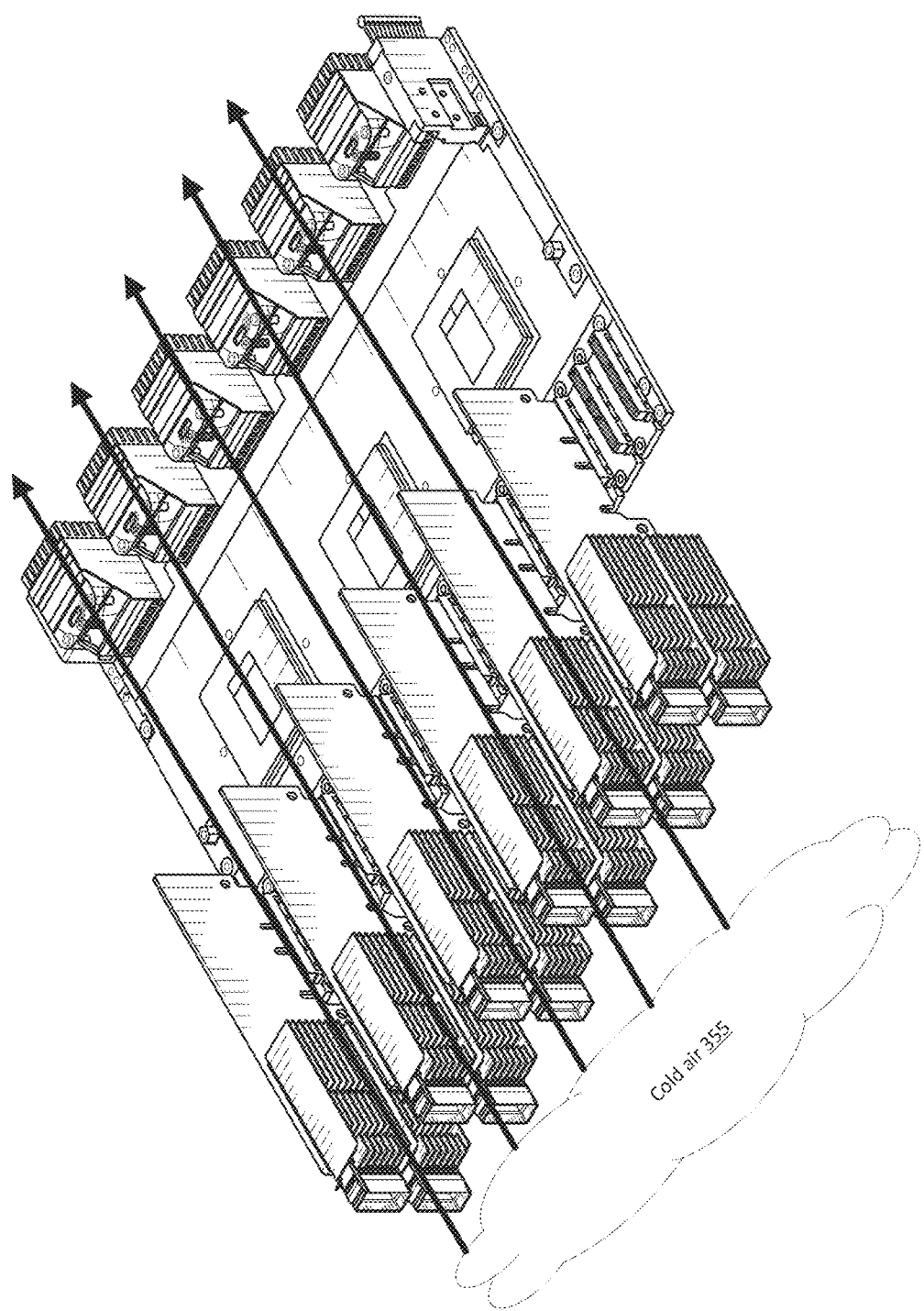
FIG. 3H is a perspective view of a network device, in accordance with some embodiments of the present disclosure.

FIG. 3H illustrates a perspective view of the network element 300. FIG. 3H shows a volume of cold air 355 in proximity to the front side 305a of the main board 305. The air in this area may be cooler than the air surrounding the processors 315 (e.g., in the center of the main board 305) owing to the heat dissipation from the processors 315. Unlike network elements using connectors in a cage configuration, the fans 321 pull cold air 355 from the front side of the main board 305 through the air channels 350 and over the processors 315, thereby providing a cooling effect on the processors 315. Further, the cold air may continue over the processors 315 to additional fabric PCBs (e.g., fabric card 110 illustrated in FIGS. 1A and 1B.) connected to the main board via connectors 320, thereby providing a cooling effect on the additional fabric PCBs. The volume of cold air 355 that can travel from the front of the main board 305 to the spaces between fans 321 for a particular fan speed may be increased over previous designs incorporating connector cage layouts (e.g., a 2×6 layout) which do not provide sufficient space between connectors and thus block cold air from the front of the main board from traveling over the processors towards the fabric PCBs connected by connectors. Such connector cage layouts may cause hot air generated by processors to be pulled by the fans through the channels between connectors and towards other fabric PCBs as discussed above. However, the circulation of the hot air towards the other fabric PCBs may cause overheating and subsequent damage to those fabric PCBs as well as to the processors of the network device. Thus, the embodiments discussed herein may allow the network device 300 to operate at a higher ambient temperature relative to previous designs because of the improved airflow providing improved cooling. As a result, the maximum operating power may be increased. The embodiments described herein may also reduce cross talk. Traditional connector cage systems utilize connectors that have long exposed leads at the top and bottom ports that are susceptible to electromagnetic coupling. However, as shown in FIGS. 3B-3F, each of the ports 330A and 330B are coupled directly to the riser card. PCB 325, and thus the lead size is reduced while the extent to which any leads of the ports 330A and 330B are exposed is also minimized. The maximum ambient temperature of the network device 300 may be based on the volume of cold air 355 pulled from the front side of the main board 305.

Figure 4:
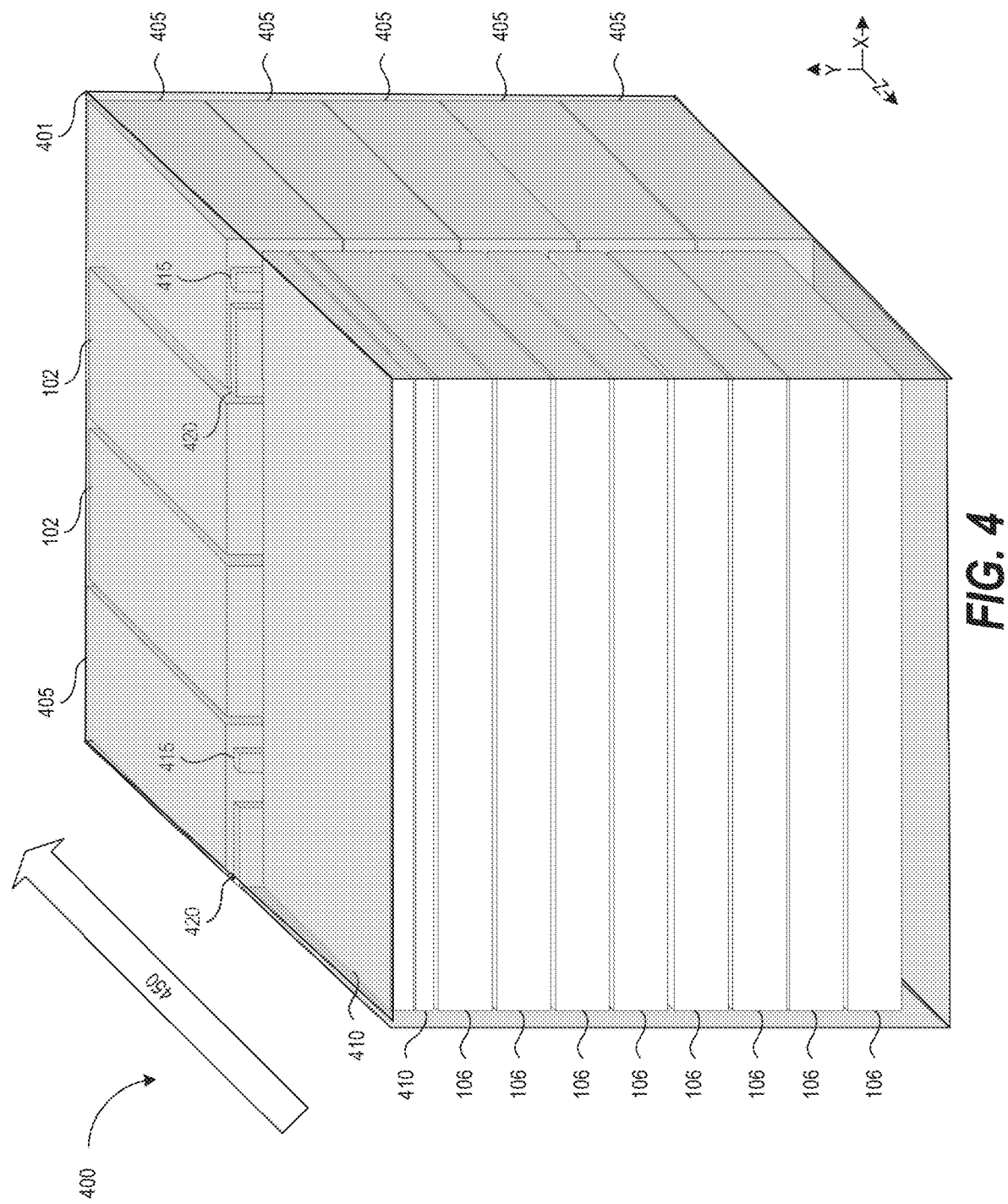
FIG. 4 is a perspective view of a network device, in accordance with some embodiments of the present disclosure.

FIG. 4 is a diagram illustrating a perspective view (e.g., an isometric view) of an example network device 400, in accordance with some embodiments of the present disclosure. As discussed above, a network device may be a device that communicates (e.g., transmits, sends, receives, forwards, etc.) data (e.g., packets, frames, message, etc.) with a network or with other devices (e.g., other computing devices, other network devices, etc.). For example, a network device may be a switch, router, hub, bridge, gateway, etc. or any type of device that can communicate data packets with a network. In other embodiments, the network device may comprise a virtual machine and/or a container (e.g., a virtual environment).

As illustrated in FIG. 4 the network device 400 includes housing 401. Housing 401 may also be referred to as a chassis. Housing 401 may be a frame, body, cage, structure, framework, etc., in which the components of network device 400 may be located. For example, one or more of line cards 106, switch cards 106, power supplies 405, printed circuit board assemblies (PCBAs) 420, busbar 415, the connectors, etc., may be located in housing 401.

Network device 400 includes a set of switch cards 102 (e.g., two switch cards). Although two switch cards 102 are illustrated, other embodiments may use any number of switch cards 102 (e.g. one switch card, four switch cards, etc.). Switch cards 102 are oriented, positioned, disposed, located, etc., parallel to each other. Each switch card 102 includes one or more connectors, such as connectors 202 illustrated in FIGS. 2 and 3. For example, each switch card 102 may include ten connectors and each of the ten connectors (of a switch card 102) may be coupled to a respective connector (such as connector 206 illustrated in FIGS. 2 and 3) on line cards 106 and/or supervisor cards 410. Thus, switch cards 102 include a set of connectors that may couple switch cards 102 to line cards 106 and supervisor cards 410.

Network device 400 also includes a set of line cards 106 (e.g., eight line cards). Although eight line cards 106 are illustrated, other embodiments may use any number of line cards (e.g. twelve line cards, four line cards, etc.). Line cards 106 are generally oriented, positioned, disposed, located, etc., parallel to each other. Line cards 106 are also oriented, positioned, disposed, located, etc., orthogonal to switch cards 102. Each line card 106 also includes a set of connectors, such as connectors 206 illustrated in FIGS. 2 and 3. For example, each line card may include two connectors, and each of the two connectors may be coupled to one of switch cards 102. Line cards 106 may allow network device 400 to communicate data with other devices and/or networks. For example, each line card may include network modules (e.g., small form factor pluggable (SFP) modules, octal SFP (OSFP) modules, quad SFP (QSFP) modules, etc.), ports, etc., that may couple network device 400 to other devices and/or networks.

In one embodiment, line cards 106 may be Power Over Ethernet (POE) line cards. For example, line cards 106 may include ports or connectors (e.g., Ethernet ports) that allow line cards 106 to connect to POE devices (e.g., devices that receive or transmit power over Ethernet). POE line cards may generate (e.g., radiate) less heat than other types of line cards because the POE line cards may deliver power to other devices over Ethernet cables and the other devices may be located away from or separate from the POE line cards. Thus, the heat generated by delivering the power to the devices may not be located at or near the POE line cards, but may be located near the devices that are receiving power from the POE line cards. In some embodiments, the network device may be able to sufficiently cool the POE line cards, the switch cards 102, and power supplies 405 by drawing in air through the POE line cards. The air is then directed through switch cards 102 and power supplies 405. Because the POE line cards may not generate as much heat as other types of line cards, this allows the air that flows through the POE line cards to sufficiently cool switch cards 102 and power supplies 405.

Network device 400 further includes power supplies 405. Power supplies 405 may be modules, components, devices, etc., which generate and/or provide power (e.g., current, voltage, etc.) to network device 400 and/or components of network device 400. For example, power supplies 405 may provide power to one or more of line cards 106, supervisor cards 410, switch cards 102, etc. Power supplies 405 may be divided into two sets or groups. The first set of power supplies 405 (e.g., the five leftmost power supplies 405) may be located on the left side of network device 400 and the second set of power supplies 405 (e.g., the five rightmost power supplies 405) may be located on the right side of network device 400.

The network device also includes a set of supervisor cards 410 (e.g., two supervisor cards). Although two supervisor cards 410 are illustrated, other embodiments may use any number of supervisor cards (e.g. twelve line cards, four line cards, etc.). Supervisor cards 410 are generally oriented, positioned, disposed, located, etc., parallel to each other, and parallel to the line cards 106. Supervisor cards 410 are also oriented, positioned, disposed, located, etc., orthogonal to the switch cards 102. Each of supervisor cards 410 may include connectors to couple supervisor cards 410 to the PCBAs 420 and switch cards 102.

In one embodiment, network device 400 may include a control plane and a data plane. The data plane receives, processes, and forwards network data using various control plane data (e.g. packet forwarding, routing, switching, security, quality of service (QoS), and other network traffic processing information). For example, for each received packet of the network traffic, the data plane determines a destination address of that packet, determines the requisite information for that destination, and forwards the packet out the proper outgoing interface. In other embodiments, the control plane may perform functions related to quality of service, access control lists management (or other types of security), policy service, fan agent, light emitting diode agent, temperature sensor agent, database service, management service(s), processes to support networking protocol, routing protocols, and/or other network flow management applications.

In one embodiment, the control plane gathers the control plane data from different sources (e.g., locally stored configuration data, via a command line interface, or other management channel such as Simple Network Management Protocol (SNMP)) and configures the data plane using the control plane data. The control plane data may include information corresponding to a plurality of different classes of control plane traffic, such as routing protocol messages, routing table messages, routing decisions messages, route update messages, unresolved traffic messages, L2 protocol messages, link aggregation control protocol messages, link layer state updates messages spanning tree messages), link state update messages (e.g., link aggregation control protocol messages for a link aggregation group, bidirectional forwarding detection messages, etc.), exception packets that cannot be dealt with in hardware (e.g., router alerts, transmission time interval messages, maximum transmission size exceeded messages, etc.), program messages (e.g., packets from a controller instructing the programming of a network element), messages for routing table misses, time control messages (e.g., precision time protocol messages), messages for packets marked as being of interest for snooping access control list logging and port mirroring messages), messages used to collect traffic diagnostics, address resolution messages (ARP) requests and replies, neighbor solicitation requests and replies, general communication to the control plane of the networking device, etc.

In one embodiment, supervisor cards 410 may be part of the control plane. Supervisor cards 410 may include hardware (e.g., processors, memories, connectors, etc.), software, and/or firmware that allow supervisor cards 410 to perform various control plane functions, as discussed above. In another embodiment, switch cards 102 may also be part of the control plane. For example, switch cards 102 may be configured by the control plane to route network data (e.g., packets, frames, etc.) to different line cards 106 which may be coupled to switch cards 102 (as discussed above).

Network device 400 further includes busbar 415. Busbar 415 may be one or more metallic strips, bars, etc., that may be used for power distribution at a higher current or higher voltage. Busbar 415 may be coupled to switch cards 102, line cards 106, supervisor cards 410, and power supplies 405. Busbar 415 may receive power from one or more of the power supplies 405 (e.g., to the two sets of power supplies 405) and may provide power to one or more of switch cards 102, line cards 106, and supervisor cards 410. Switch cards 102, line cards 106, supervisor cards 410, and power supplies 405 may be coupled to busbar 415 via clips, prongs, or other types of appropriate connectors. In one embodiment, using busbar 415 allows the network device to provide power to components without distributing power via a printed circuit board. For example, if a printed circuit board were used to distribute power to switch cards 102, line cards 106, and supervisor cards 410, the printed circuit board may be larger and thicker than the printed circuit board assemblies (PCBAs) 420. This would increase the cost and complexity of network device 400. In addition, this would also decrease the amount of airflow through network device 400 because the larger printed circuit board may block some of the airflow. For example, a larger printed circuit board may block air from flowing through line cards 106, to switch cards 102 and the power supplies 405. Furthermore, because busbar 415 is used to distribute power to components of network device 400 (instead of a printed circuit board), a single printed circuit board may be divided into multiple smaller printed circuit boards, PCBAs 420. For example, a larger mid-plane PCBA may deliver the power the different components of the network device 400 (e.g., line cards 106, switch cards 102, supervisor cards 410, etc.). However, the mid-plane PCBA may obstruct airflow. Because busbar 415 may be located or positioned adjacent to the sides of the network device air may flow more easily through the center portion of the network device 400. This may also allow for better airflow through network device 400.

In one embodiment, busbar 415 may have a U-shape (e.g., as illustrated in FIG. 5). For example, the vertical portions of the U-shape (A and C) may be generally oriented, positioned, disposed, located, etc., on the left and right side of the network device 400 and the horizontal portion of the U-shape (B) may be oriented, positioned, disposed, located, etc., on the bottom of network device 400. Busbar 415 may include multiple bars and each of the bars may be formed as one continuous piece, or may be constructed from multiple pieces connected (e.g., soldered together. In other embodiments different shapes of busbars and different numbers of busbars may be used. For example, the busbar may have an H-shape.

As illustrated in FIG. 4, switch cards 106 are generally oriented, positioned, disposed, located, etc., between leftmost power supplies 405 (e.g., the first set of power supplies 405) and rightmost power supplies 405 (e.g., the second set of power supplies 405). Switch cards 106 are also generally oriented, positioned, disposed, located, etc., such that the width of the line card runs along the Y-axis. Also as illustrated in FIG. 4, line cards 106 and supervisor cards 410 are generally oriented, positioned, disposed, located, etc., in front of switch cards 102, and power supplies 405.

Network device 400, in an embodiment, further includes two printed circuit board assemblies (PCBAs) 420. One PCBA 420 is generally oriented, positioned, disposed, located, etc., toward the left side of the network device 400 and the other PCBA 420 is generally oriented, positioned, disposed, located, etc., toward the right side of the network device 400. PCBAs 420 are also generally oriented, positioned, disposed, located, etc., between power supplies 405, and line cards 106 and supervisor cards 410. A PCBA may also be referred to as a PCB, a hoard, a circuit board, etc.

In one embodiment, PCBA 420 on the left side of network device 400 may be coupled to supervisor cards 410 and leftmost power supplies 405 (e.g., the first set of power supplies 405). PCBA 420 on the right side of network device 400 may be coupled supervisor cards 410, line cards 106, and rightmost power supplies 405 (e.g., the second set of power supplies 405).

In one embodiment, PCBAs 420 may be coupled to each other via supervisor cards 410. For example, each supervisor card 410 may be coupled to both PCBAs 420. Because supervisor cards 410 may be coupled to both of PCBAs 420, supervisor cards 410 may allow data (e.g., packets, messages, frames, or other information) to be communicated between PCBAs 420. For example, supervisor cards 410 may be a bridge, connection, etc., between two PCBAs 420.

In one embodiment, network device 400 may allow air to flow through the network device in the direction indicated by arrow 450 (see FIG. 4). Airflow from the front of network device 400 may directed through line cards 106 and/or supervisor cards 410. For example, the airflow (e.g., the moving or flowing air) may be directed through gaps between line cards 106 and/or supervisor cards 410. In another example, the air may flow through openings, channels, etc., within line cards 106 and/or supervisor cards 410. The airflow may be directed towards switch cards 102 through line cards 106 and/or supervisor cards 410. For example, the air may flow through the gaps between line cards 106 and/or switch cards 102 (or through openings, channels, etc., within the line cards 106 and/or switch cards 102) towards the back of the network device 400. The airflow may be directed towards power supplies 405 through line cards 106, supervisor cards 410, and/or busbar 415. For example, the air may flow through the gaps between line cards 106, switch cards 102, and/or busbar 415 (or through openings, channels, etc., within the line cards 106 and/or switch cards 102). The air may continue to flow through or past power supplies 405 (e.g., through openings, holes, channels, gaps, etc., in power supplies 405) towards the back of network device 400. This allows for a sufficient amount of air to flow through network device 400 to cool the components of network device 400. For example, this allows line cards 106, switch cards 102, and power supplies 405 to be cooled by the airflow.

In one embodiment, PCBAs 420 may be referred to as a midplane. Dividing the midplane into two separate PCBAs 420 may allow for better airflow through the network device 400. For example, because PCBAs 420 located on the sides of network device 400 (e.g., the left side and the right side), air may flow through the middle portion of network device 400. Although two PCBAs 420 are separate from each other, PCBAs 420 may still communicate data with each other because they are connected via supervisor cards 410.

In one embodiment, network device 400 (e.g., a housing of the network device 400) may have a height of ten rack units (RUs). A rack unit (RU) may be a unit of measurement that is based on a standard rack specification as defined by the Electronic Industries Alliance (EIA). For example, a RU may be 1.75 inches (i.e., 1 and ¾ inches) or 44.45 millimeters (mm) as defined by the EIA-310 standard. Thus, network device 400 may have a height of approximately 17.5 inches or 444.5 mm. In another embodiment, each line card 106 has a height of one RU. For example, each line card 106 may be 1.75 inches or 44.5 mm high. In a further embodiment, each supervisor card 460 may have a height of one half (e.g., ½) of a rack unit (RU). For example, each supervisor card may be 0.875 inches or 22.25 mm high.

As discussed above, network device 400 may be installed on or attached to racks (e.g., rack mounts, rack frames, etc.). Generally, racks have a fixed and/or standardized size. For example, a rack may have a certain height. The height of the racks may limit the number of network devices that may be mounted to the racks. For example, if a rack has a height of 20 feet, and each network device has a height of 2 feet, then 10 network devices may be installed in the rack. It may be desirable to install more network devices on a rack to reduce the number of racks used to house the network devices. For example, installing more devices on a rack may reduce the number of racks that are used, which may reduce the space used by the racks (e.g., space within a data center). Thus, it may be useful to be able to install more network devices in existing racks.

The examples, implementations, and embodiments described herein allow for a more compact, smaller, shorter, etc., network device 400. For example, network device 400 (which has a height of 10 RU in one embodiment) may be shorter than traditional network devices (which may have heights of 13 RU). One or more of the various embodiments described herein may allow network device 460 to have a reduced or more compact size (e.g., a smaller height). For example, the orthogonal arrangement of line cards 106 and switch cards 102 allows for better airflow through network device 400 while allowing line cards 106 and switch cards 102 to be interconnected with each other. Orienting, placing, positioning, locating, etc., power supplies 405 in-line with line cards 106 (e.g., behind the line cards 106) allows network device 400 to be shorter in height because the power supplies are no longer located above or below line cards 106 as in traditional switches. In addition, orienting, placing, positioning, locating, etc., power supplies 405 on the sides (e.g., left and right sides) of network device 400 allows for better airflow through the middle portion of network device 400. Separating the mid-plane into PCBAs 420 also allows for better airflow through network device 400. Orienting, placing, positioning, locating, etc., busbar 415 between line cards 106 and switch cards 102 and power supplies 405 allows power (from power supplies 405) to be distributed to all of the components of the network device (e.g., the line cards 106, the switch cards 102, the supervisor cards 410, etc.) from a single central location.

In one embodiment, network device 400 may include eight line cards 106, two supervisor cards 410, two switch cards 106 and power supplies 405 within the height of 10 RU. This may be a significant reduction in height when compared to traditional network devices that may have a height of 13 RU or even 12 RU. The reduced height and/or the increased compactness (when compared with traditional network devices) of network device 400 allows for more network devices to be installed within a rack which may reduce the amount of spaced used by the racks (e.g., the amount of space used in a data center). In addition, the in-line positioning or location of line cards 106, switch cards 102, supervisor cards 410, and power supplies 405 allow for sufficient cooling of network device 400, even with the reduced height and/or increased compactness.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended not to invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA, an ASIC, or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks, "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A system comprising:
a first printed circuit board (PCB) comprising a plurality of common connectors;
one or more second PCBs, each second PCB coupled to the first PCB by a respective common connector of the plurality of common connectors, and wherein the one or more second PCBs are arranged vertically parallel on a front side of the first PCB such that each second PCB forms a 90 degree angle with the first PCB to allow air to flow in spaces defined between vertically adjacent second PCBs, each second PCB including:
a set of ports, each port in the set of ports coupled to the respective common connector via the second PCB;
a rear side of a bottom edge of the second PCB configured to couple to the respective common connector; and
a front side of the bottom edge of the second PCB extending past the rear side of the bottom edge and extending over and below the front side of the first PCB.

2. The system of claim 1, wherein each of the one or more second PCBs is outside a thermal proximity of any other second PCB.

3. The system of claim 2, wherein the first PCB further comprises:
one or more application specific integrated circuits (ASICS); and
one or more fans to pull air from the front side of the first PCB through the spaces defined between vertically adjacent second PCBs and over the one or more ASICS.

4. The system of claim 3, further comprising:
one or more fabric PCBs, wherein the one or more fans pull air from the front side of the first PCB through the spaces defined between vertically adjacent second PCBs and over the one or more ASICS towards the one or more fabric PCBs.

5. The system of claim 3, wherein a maximum ambient temperature of the first PCB is based on a volume of the air pulled from the front side of the first PCB through the spaces defined between vertically adjacent second PCBs.

6. The system of claim 1, wherein each common connector is configured to hold a respective second PCB in place.

7. The system of claim 1, wherein for each second PCB, a signal delay between each port in the set of ports and the first PCB is equal.

8. The system of claim 1, wherein each second PCB further comprises:
a media access control (MAC) application specific integrated circuit (ASIC) coupled adjacent to a rear side of the second PCB and adjacent to the set of ports.

9. The system of claim 8, wherein each second PCB further comprises a heat sink coupled to the MAC ASIC.

10. The system of claim 8, wherein each MAC ASIC performs media access control security functions.

11. The system of claim 1, wherein for each second PCB, each port in the set of ports comprises a quad small form factor pluggable-double density (QSFP-DD) module.

12. The system of claim 1, wherein for each second PCB, each port in the set of ports comprises an octal small form factor pluggable (OSFP) module.

13. A system comprising:
a first printed circuit board (PCB) comprising a plurality of common connectors;
one or more second PCBs, each second PCB coupled to the first PCB by a respective common connector of the plurality of common connectors, and wherein the one or more second PCBs are arranged vertically parallel on a front side of the first PCB at 90 degree angles with the first PCB to allow air to flow in spaces defined between vertically adjacent second PCBs, each second PCB including:
a set of ports at a front side of the second PCB, each port in the set of ports configured to receive a device; and
a mechanism at a rear side of a bottom edge of the second PCB, the mechanism configured to couple to one of the common connectors and wherein the second PCB includes a top edge and a front side of the bottom edge of the second PCB extends farther from the top edge than the rear side of the bottom edge extends from the top edge.

14. The system of claim 13, further comprising on each second PCB a media access control (MAC) application specific integrated circuit (ASIC) coupled adjacent to the rear side of the PCB and adjacent to the set of ports.

15. The system of claim 14, wherein the MAC ASIC performs media access control security functions.

16. The system of claim 14, further comprising a heat sink coupled to the MAC ASIC.

17. The system of claim 13, wherein each port in the set of ports comprises an octal small form factor pluggable (OSFP) module.

18. The system of claim 13, wherein each port in the set of ports comprises a quad small form factor pluggable-double density (QSFP-DD) module.

19. A network device, comprising:
a line card including a line card printed circuit board (PCB), the line card PCB including:
a plurality of common connectors adjacent a front side of the line card PCB;
at least one processor between the plurality of common connectors and a rear side of the line card PCB; and
one or more riser card PCBs, each riser card PCB configured to be coupled to the line card PCB by a respective one of the plurality of common connectors and including a set of ports at a front side of the riser card PCB, each port in the set of ports configured to receive a device and the one or more riser card PCBs arranged vertically parallel on the front side of the line card PCB and at 90 degree angles with the line card PCB to allow air to flow from the front side of each riser card PCB through spaces defined between vertically adjacent riser card PCBs to cool the at least one processor.

20. The network device of claim 19, wherein each riser card PCB has a top edge and has a bottom edge having a front side and a rear side, the rear side of the bottom edge configured to couple to a respective one of the plurality of common connectors and the front side of the bottom edge of the riser card PCB extending farther from the top edge than the rear side of the bottom edge extends from the top edge.

* * * * *